United States Patent
Ge et al.

(10) Patent No.: US 9,953,991 B2
(45) Date of Patent: Apr. 24, 2018

(54) EPROM CELL WITH MODIFIED FLOATING GATE

(71) Applicant: HEWLETT-PACKARD DEVELOPMENT COMPANY, L.P., Houston, TX (US)

(72) Inventors: Ning Ge, Palo Alto, CA (US); Leong Yap Chia, Singapore (SG); Jose Jehrome Rando, Singapore (SG)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/119,989

(22) PCT Filed: Mar. 14, 2014

(86) PCT No.: PCT/US2014/027114
§ 371 (c)(1),
(2) Date: Oct. 17, 2016

(87) PCT Pub. No.: WO2015/137960
PCT Pub. Date: Sep. 17, 2015

(65) Prior Publication Data
US 2017/0069639 A1    Mar. 9, 2017

(51) Int. Cl.
*H01L 29/423*    (2006.01)
*H01L 27/115*    (2017.01)
(Continued)

(52) U.S. Cl.
CPC ........... *H01L 27/11519* (2013.01); *B41J 2/14* (2013.01); *H01L 21/28273* (2013.01);
(Continued)

(58) Field of Classification Search
CPC .......... H01L 29/42324; H01L 29/4238; H01L 29/7881; H01L 27/11519; H01L 27/11524; B41J 2/14
See application file for complete search history.

(56) References Cited

U.S. PATENT DOCUMENTS 6,300,181 B1    10/2001    Patelmo et al.
6,528,842 B1 *    3/2003    Luich ................ H01L 29/42324
257/314
(Continued)

FOREIGN PATENT DOCUMENTS

WO    WO2013048376    4/2013

OTHER PUBLICATIONS

Kedzierski et al.; Complementary Silicide Source/Drain Thin-Body MOSFETs for the 20 nm Gate Length Regime; IEEE; Dec. 10-13, 2000; pp. 57-60.

*Primary Examiner* — Allison P Bernstein
(74) *Attorney, Agent, or Firm* — HP Inc. Patent Department

(57) ABSTRACT

An electronically programmable read-only memory (EPROM) cell includes a semiconductor substrate having source and drain regions; a floating gate, adjacent to the source and drain regions and separated from the semiconductor substrate by a first dielectric layer, the floating gate including: a polysilicon layer formed over the first dielectric layer; a first metal layer electrically connected to the polysilicon layer, where the surface area of the first metal layer is less than 1000 µm$^2$; and a control gate comprising a second metal layer, capacitively coupled to the first metal layer through a second dielectric material disposed therebetween.

14 Claims, 5 Drawing Sheets

(51) Int. Cl.
*H01L 27/11519* (2017.01)
*H01L 29/78* (2006.01)
*H01L 29/788* (2006.01)
*H01L 27/11524* (2017.01)
*H01L 21/28* (2006.01)
*B41J 2/14* (2006.01)

(52) U.S. Cl.
CPC .... *H01L 27/11524* (2013.01); *H01L 29/4238* (2013.01); *H01L 29/42324* (2013.01); *H01L 29/78* (2013.01); *H01L 29/7881* (2013.01)

(56) References Cited

U.S. PATENT DOCUMENTS

| | | | |
|---|---|---|---|
| 6,838,373 B2 | 1/2005 | Honeycutt | |
| 7,365,387 B2 * | 4/2008 | Benjamin | B41J 2/04541 |
| | | | 257/317 |
| 7,808,037 B2 | 10/2010 | Chang et al. | |
| 9,252,149 B2 * | 2/2016 | Ge | H01L 29/7881 |
| 2004/0109380 A1 | 6/2004 | Yang et al. | |
| 2005/0161744 A1 | 7/2005 | Frapreau et al. | |
| 2007/0191371 A1 | 8/2007 | Bennett et al. | |
| 2008/0007597 A1 | 1/2008 | Edelen et al. | |
| 2008/0112225 A1 | 5/2008 | Benjamin | |
| 2013/0329498 A1 * | 12/2013 | Villavelez | G11C 16/10 |
| | | | 365/185.15 |
| 2014/0218436 A1 * | 8/2014 | Ge | H01L 29/7881 |
| | | | 347/19 |

\* cited by examiner

EPROM CELL WITH MODIFIED FLOATING GATE

BACKGROUND

Inkjet technology is widely used for precisely and rapidly dispensing small quantities of fluid. Inkjets eject droplets of fluid out of a nozzle by creating a short pulse of high pressure within a firing chamber. During printing, this ejection process can repeat thousands of times per second. Inkjet printing devices are implemented using semiconductor devices, such as thermal inkjet (TIJ) devices or piezoelectric inkjet (PIJ) devices. For example, a TIJ device is a semiconductor device including a heating element (e.g., resistor) in the firing chamber along with other integrated circuitry. To eject a droplet, an electrical current is passed through the heating element. As the heating element generates heat, a small portion of the fluid within the firing chamber is vaporized. The vapor rapidly expands, forcing a small droplet out of the firing chamber and nozzle. The electrical current is then turned off and the heating element cools. The vapor bubble rapidly collapses, drawing more fluid into the firing chamber.

BRIEF DESCRIPTION OF THE DRAWINGS

Some embodiments of the invention are described with respect to the following figures.

DETAILED DESCRIPTION

Figure 1:
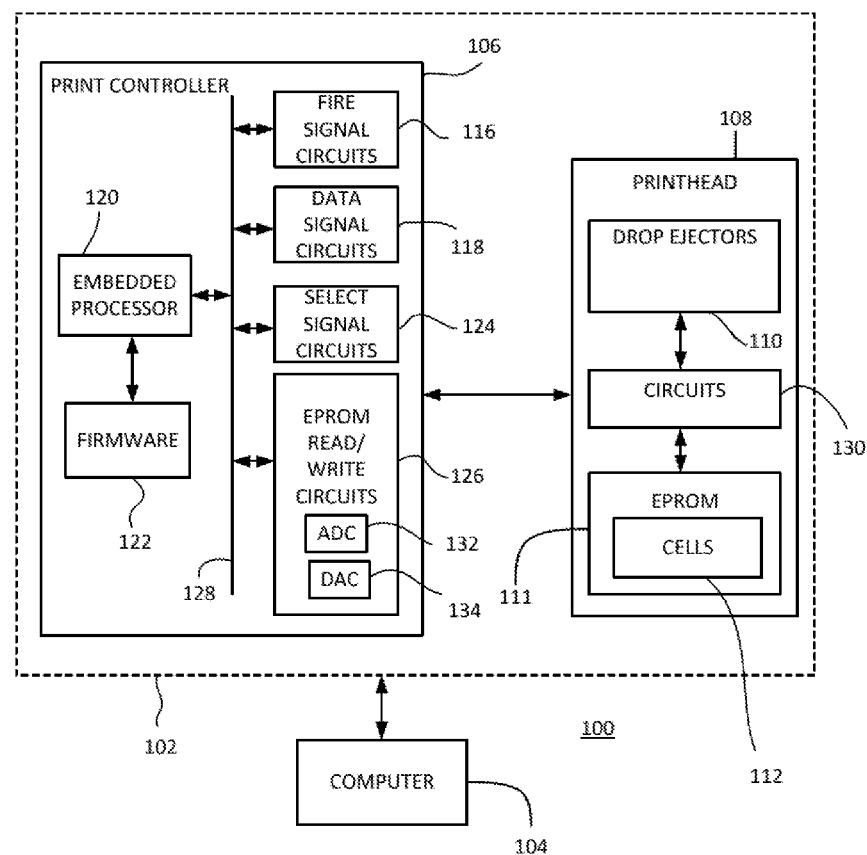
FIG. 1 is a block diagram of an ink jet printer according to an example implementation.

FIG. 1 is a block diagram of an ink jet printer 102 according to an example implementation. The ink jet printer 102 includes a print controller 106 and a printhead 108. The print controller 106 is coupled to the printhead 108. The print controller 106 receives printing data representing an image to be printed to media (media not shown for clarity). The print controller 106 generates signals for activating drop ejectors on the printhead 108 to eject ink onto the media and produce the image. The print controller 106 provides the signals to the printhead 108 based on the printing data.

The print controller 106 can be implemented using at least one integrated circuit (IC), such as an application specific integrated circuit (ASIC), programmable IC (e.g., field programmable gate array (FPGA)), or the like. The print controller IC(s) can be digital IC(s), analog IC(s), mixed-signal IC(s), or any combination thereof. The print controller 106 includes an embedded processor 120, firmware 122, fire signal circuits 116, data signal circuits 118, select signal circuits 124, and read/write circuits for an electronically programmable read-only memory (EPROM) ("EPROM read/write circuits 126"). The components of the print controller 106 can generally communicate with one another using various interface circuits 128.

The printhead 108 includes a plurality of drop ejectors 110, an EPROM 111, and associated integrated circuitry 130. The EPROM 111 includes a plurality of cells 112 each configured to store information (e.g., a "bit" of information). As described further below, each of the cells 112 can include a floating gate transistor with a modified gate structure that allows for smaller cell size. Smaller cell size enables higher cell packing density, which can allow for an EPROM that occupies less silicon real estate (reducing cost) or an EPROM capable of store more information for a given size.

The EPROM 111 can be used to store various information, such as identification information for the printhead 108. The cells 112 can be mapped into banks addressable using a row and column select addressing scheme for reading and writing. The circuits 130 can include, for example, an address generator or the like for addressing the EPROM 111 using row and column select signals, as discussed further below.

The drop ejectors 110 are in fluidic communication with an ink supply (not shown) for receiving ink. For example, ink can be provided from a container. In an example, the printhead 108 is a thermal ink jet (TIJ) device. The drop ejectors 110 generally include a heating element, a firing chamber, and a nozzle. Ink from the ink supply fills the firing chambers. To eject a droplet, an electrical current is passed through the heater element placed adjacent to the firing chamber. The heating element generated heat, which vaporizes a small portion of the fluid within the firing chamber. The vapor rapidly expands, forcing a small droplet out of the firing chamber and nozzle. The electrical current is then turned off and the resistor cools. The vapor bubble rapidly collapses, drawing more fluid into the firing chamber from the ink supply. In other examples, the printhead 108 can be a piezoelectric ink jet (PIJ) device or other type of device that ejects ink.

In the print controller 106, the fire signal circuits 116 generate fire signals for driving the drop ejectors 110 to eject ink. The data signal circuits 118 generate data signals that can be used by the printhead 108 (e.g., the circuits 130) for various purposes, such as address generation for the drop ejectors 110 and the EPROM 111. The select signal circuits 1124 generate select signals for clocking and state control of logic in the printhead 108 using the data signals (e.g., the circuits 130). The EPROM read/write circuits 126 read from and write to the EPROM 111. In an example, the EPROM read/write circuits 126 can include an analog-to-digital converter (ADC) 132 used to read from the cells 112 and provide digitized representations thereof. The EPROM read/write circuits 126 can also include a digital-to-analog converter (DAC) 134 for writing to the cells 112 based on a digital input. The embedded processor 120 executes instructions stored in the firmware 122 to provide control of at least a portion of the fire signal circuits 116, the data signal circuits 118, the select signal circuits 124, and the EPROM read/write circuits 126.

Figure 2:
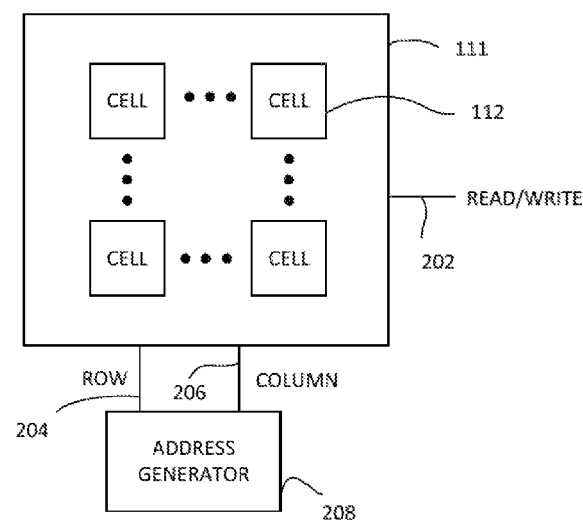
FIG. 2 is a block diagram showing an EPROM according to an example implementation.

FIG. 2 is a block diagram showing the EPROM 111 according to an example implementation. The EPROM 111 includes the cells 112 formed into an array of rows and columns. Each of the cells 112 is configured to store a bit of information. An address generator 208 is configured to generate address signals. The address generator 208 couples the address signals to a row bus 204 and a column bus 206. Individual cells 112 can be selected using a row and column address signals. Individual cells 112 can be read from or written to using the read/write line 202.

Figure 3:
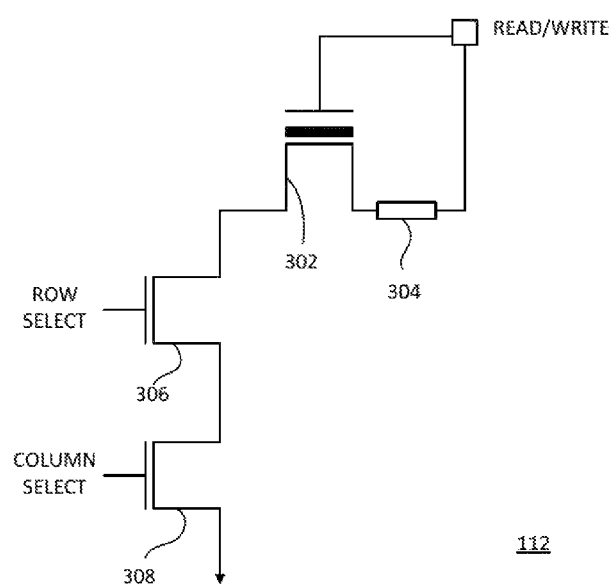
FIG. 3 is a block diagram showing an EPROM cell according to an example implementation.

FIG. 3 is a block diagram showing a cell 112 according to an example implementation. The cell 112 includes a transistors 302, 306, and 308, and a resistor 304. The transistors 302, 306, and 308 are field effect transistors (FETs), such as N-type metal oxide semiconductor FETs (MOSFETs). A source of the transistor 302 is coupled to the read/write line through the resistor 304. A drain of the transistor 302 is coupled to a source of the transistor 306. A drain of the transistor 302 is coupled to a source of the transistor 308. A drain of the transistor 308 is coupled to a reference voltage, such as electrical ground. A floating gate of the transistor 302 is coupled to the read/write line as control gate. A gate of the transistor 306 is coupled to a column select line. A gate of the transistor 308 is coupled to a row select line.

The transistor 302 has a "floating gate" (i.e., the gate is electrically isolated) and is configured as the EPROM transistor. Programming of the call is achieved by biasing the drain junction of the transistor 302 to avalanche breakdown, where the electrons in the avalanche area were injected from the drain region into the floating gate through hot carrier injection and Fowler-Nordheim tuning as free electrons and retained when power is removed. With the electrons trapped into the floating gate, gate voltage of the transistor 302 becomes more negative. The on-resistance (Ron) is thus increased to a certain value when voltage is applied to the control gate connected to read/write line. If no voltage is applied to the read/write line, the Ron does not increase. By either programming or not programming the cell 112 (e.g., applying or not applying a voltage to the read/write line), two difference Ron resistances can be achieved, which can be sensed as two distinct states: logic '1' and logic '0'. The resistor 304 can provide a current limiter and cooperates with the transistors 306 and 308 to select the transistor 302.

The transistors 306 and 308 determine whether the transistor 302 is biased for reading/writing. When both the transistors 306 and 308 are turned on, the transistor 302 is biased and configured for reading/writing. If either of the transistors 306 and 308 is turned off, then the transistor 302 is not biased and cannot be programmed or read. When the transistor 302 is biased, the Ron of the transistor 302 can be measured (read) or altered (written) as discussed above through the read/write line. Generally, the transistors 306 and 308 exhibit a lower resistance (e.g., on the order of 100 ohms) as compared to the Ron of the transistor 302 (e.g., on the order of 1000 ohms). Thus, the overall resistance of the cell 112 measured from the read/write line primarily depends on the Ron of the transistor 302, with the transistors 306 and 308 providing parasitic resistance. The parasitic resistance measurement by the transistors 306 and 308 is not negligible and can affect the program ratio of the cell 112. The "program ratio" can be defined as the resistance of the cell 112 after programming divided by the resistance of the cell 112 before programming. Lower program ratio can cause yield loss during manufacturing, as the "programmed" and not programmed resistance states become more difficult to distinguish and hence the cell 112 cannot effectively store a bit of information.

Figure 4:
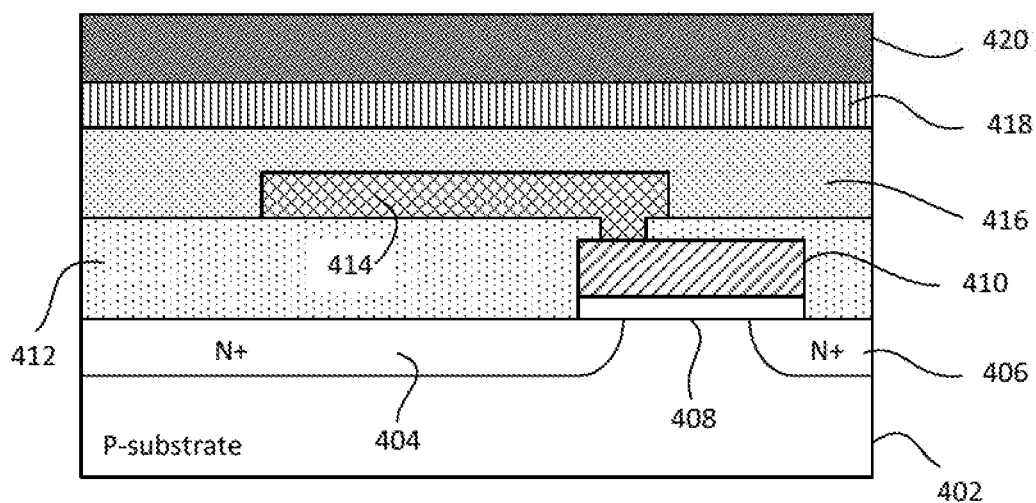
FIG. 4 depicts a cross-section of a floating-gate transistor according to an example implementation.

FIG. 4 depicts a cross-section 400 of the floating-gate transistor 302 according to an example implementation. The cross-section 400 shows a semiconductor substrate 402 having diffusion regions 404 and 406. In the example shown, the substrate 402 is a P-type substrate and the diffusion regions 404 and 406 are N+ diffusion regions. In other examples, the substrate 402 may be an N-type substrate or an N-type well in a P-type substrate and the diffusion regions 404 and 406 can be P+ diffusion regions. In the example shown, the EPROM cell 112 is formed using a no-field oxide process and thus the transistors therein, including the floating-gate transistor 302, include an enclosed gate structure for isolation (example shown in FIG. 5 discussed below). It is to be understood, however, that in other examples the floating-gate transistor 302 can be formed using a field oxide process where field oxide is employed for transistor isolation.

A gate-oxide layer 408 is formed overlapping the diffusion regions 404 and 406. The gate-oxide layer 408 can be $SiO_2$ or like type oxide materials. A polysilicon layer 410 is formed on the gate-oxide layer 408. A dielectric layer 412 is formed over the polysilicon layer 410 and the substrate 402. The dielectric layer 412 can be undoped silicate glass (USG), phosphosilicate glass (PSG), borophosphosilicate glass (BPSG), or other known dielectric materials.

A metal layer 414 is formed on the dielectric layer 412. The metal layer 414 is referred to as the "first metal layer" or M1. A void or "via" is formed in the dielectric layer 412 such that the metal layer 414 can extend through the dielectric layer 412 and contact the polysilicon layer 410. In this manner, the metal layer 414 is in electrical contact with the polysilicon layer 410. The metal layer 414 can be aluminum, copper, or various alloys thereof (e.g., AlCu, AlSi, AlCuSi), or other known metals or metal alloys.

A dielectric layer 416 is formed on the metal layer 414 and the dielectric layer 412. The dielectric layer 416 can be tetraethyl orthosilicate silicon dioxide (TEOS), $Si_3N_4$, or a combination of such layers, or other known dielectric materials or combinations of such other dielectric materials. A metal layer 418 is formed on the dielectric layer 416. The metal layer 418 is referred to as the "second metal layer" or M2. The metal layer 418 can be aluminum, copper, or various alloys thereof (e.g., AlCu, TaAl), or other known metals or metal alloys. A dielectric layer 420 is formed on the metal layer 418. The dielectric layer 420 can be SiC, $Si_3N_4$, or other known dielectric layers.

The metal layer 414 and the polysilicon layer 410 together create a floating-gate for the transistor 302. The floating gate is separated from the substrate 402 by the gate-oxide layer 408. The metal layer 418 is capacitively coupled to the metal layer 414 through the dielectric layer 416. The metal layer 418 creates a control gate for the transistor 302. In the cross-section 400, the second metal layer 418 spans the entire area of the floating-gate transistor 302. In some examples, the second metal layer 418 can span the entire area of an EPROM cell 112 or a plurality of EPROM cells 112 (e.g., a bank of EPROM cells 112). Thus, the metal layer 418 can provide a single control gate for a floating-gate transistor in one EPROM cell 112 or a plurality of EPROM cells 112.

Two metrics by which performance of the floating-gate transistor 302 can be measured include program ratio (discussed above) and coupling ratio. As used herein, the coupling ratio is defined as $C_{Control}/(C_{Control}+C_{FG})$, where $C_{Control}$ is the capacitance between the second metal layer 418 and the first metal layer 414 through the dielectric 416 and $C_{FG}$ is the capacitance between the floating-gate and the substrate 402. The capacitance $C_{FG}$ is the sum of: the capacitance between the first metal layer 414 and the substrate 402 through the dielectric layer 412 ($C_{Parasitic}$); the capacitance between the polysilicon layer 410 and the substrate 402 through the gate-oxide layer 408 ($C_{GOX}$); the capacitance between the polysilicon layer 410 and the diffusion region 404 through the dielectric layer 412 ($C_{GS\_overlap}$); and the capacitance between the polysilicon layer 410 and the diffusion region 406 through the dielectric layer 412 ($C_{GD\_overlap}$). As $C_{parasitic}$, $C_{GOX}$, $C_{GS\_overlap}$, and $C_{GD\_overlap}$ are in parallel, the total capacitance $C_{FG}$ is the sum thereof. $C_{GOX}$ is the dominant factor for $C_{FG}$ and is defined by $C_{GOX} = \in A/T_{OX}$, where $\in$ is the dielectric constant of the dielectric layer 412. A is the area defined by the gate length and width, and $T_{ox}$ is the thickness of the gate-oxide layer 408.

The floating-gate structure of the transistor 302 contributes significantly to the overall area of the EPROM cell 112. Specifically, the area of the metal layer 414. In some float-gate transistor structures similar to the cross-section 400, the metal layer portion of the floating gate can have a surface area of at least 1000 µm, providing a coupling ratio of about 0.77. A metal layer of such a surface area can represent 55% or more of the overall size of the EPROM cell. Heretofore, the size of the metal layer portion of the floating gate has not be changed due to the concern of reducing the coupling ratio and/or program ratio and hence performance of the floating gate transistor.

The inventors have discovered that the surface area of the first metal layer 414 in the cross-section 400 can be reduced to less than 1000 µm. In one specific example, the surface area of the first metal layer 414 can be reduced to a value between about 500 µm and 250 µm inclusive of the endpoints (e.g., a 50%-75% reduction in size) with a coupling ratio between about 0.6 and 0.5. In another specific example, the surface area of the first metal layer 414 can be reduced to a value less than 400 µm exclusive and greater than 250 µm inclusive with a coupling ratio between about 0.6 and 0.5. The reduced surface area of the first metal layer 414 will allow for either reduced area EPROM or an EPROM capable of storing more bits given the same area.

Although the coupling ratio is reduced with the reduction in surface area of the first metal layer 414, the inventors have discovered that such reduction in coupling ratio can be compensated through function and/or process tuning, as described below. Also, the reduction in surface area of the first metal layer 414 results in an increase in resistance (Ron) of the transistor 302 in the un-programmed state and hence a decrease in program ratio. The inventors have discovered that such reduction in program ratio can be compensated through process tuning, as described below.

As noted above, programming of the EPROM cell 112 is achieved by biasing the drain junction of the transistor 302 to avalanche breakdown, which traps electrons in the floating gate and increases Ron. The period of time during which such biasing is applied is referred to herein as "writing time." The reduction in coupling ratio noted above can affect writing efficiency. To compensate, writing time can be increases to allow for more electron injection during programming. The writing time can be a functional tuning parameter set in the firmware 122 and can be tuned through testing and measurement given a particular surface area of the first metal layer 414.

In an example, each of the cells 112 can include a short-channeled gate (SCG) design for row and column select transistors, which increases program ratio and tightens resistance distribution. The SCG design for row and column select transistors can be a design or process tuning parameter (for example, over-etching polysilicon during polysilicon etch).

As discussed above, the EPROM can be programmed by changing the Ron of the programmable transistor in selected ones of the cells. Thereafter, a cell can be sensed to measure the Ron and decode the stored information (e.g., logic '1' or logic '0' based on Ron). Thus, it becomes important that the change in Ron of the programmable transistor from one state to another be enough to be detectable. In addition, the total resistance of the cell is affected by the parasitic resistance of the select transistors. The inventors have found that the Ron of short-channeled select transistors is reduced as compared to long-channeled transistors, thereby reducing the parasitic resistance in the cell and increasing the program ratio (i.e., the ratio of total cell resistance after programming to total cell resistance before programming). Short-channeled transistors exhibit various secondary effects, such as drain-induced barrier lowering and punch through, surface scattering, velocity saturation, impact ionization, hot electron effect, and the like. Such secondary effects are often undesirable, leading designers to use long-channeled devices instead. The inventors have found that in the cells described herein, the configuration of the select transistors is such that the secondary effects do not affect the operation of the cell, while the reduction in Ron reduces parasitic resistance. Thus, short-channeled transistors can be used in the cell where such devices have heretofore been avoided.

Notably, referring to FIG. 3, the transistors 306 and 308 can be designed with a short-channeled gate to lower the parasitic resistance effect and thereby increase the program ratio of the cell 112. The SCG transistors 306 and 308 also increase hot carrier injection for the transistor 302 to have a tighter distribution. In electronics, a short-channel effect (SCE) is an effect whereby a MOSFET has a channel length on the same order of magnitude as the depletion-layer widths of the source and drain junction. Such a short channel causes several secondary effects, such as drain induced barrier lowering and punch through, surface scattering, velocity saturation, impact ionization, and hot electron effect. Short-channel transistors also exhibit a lower Ron. That is, as the channel length is reduces, the Ron is also reduced. Since the transistors 306 and 308 are connected to the lower potential side of the transistor 302 (e.g., a small voltage drop to the reference voltage over the transistors 306 and 308 due to the voltage divide effect), avalanche breakdown or other short-channel effects do not impact operation of the cell 112.

Consider the following example. Assume the transistor 302 has a Ron of 3000 ohms before programming and 6000 ohms after programming. Assume further that the Ron of a non-SCG column select transistor is 100 ohms, and the Ron of a non-SCG row select transistor is 200 ohms. Thus, the total resistance of such an EPROM cell before programming is 3300 ohms and after programming is 6300 ohms. This results in a program ratio of 1.91. Now assume the column and row select transistors have short-channeled gates, as described above for the transistors 306 and 308. For example, the transistor 306 can have a Ron of 50 ohms, and the transistor 308 can have a Ron of 100 ohms. Thus, the total resistance of the cell 112 before programming is 3150 ohms and after programming is 6150 ohms. This results in a program ratio of 1.95 and above, which is improved over the first scenario where the row and column select transistors do not have short-channeled gates due to the lower parasitic effect and gained HCl efficiency improvement.

The need for functional and/or process tuning as described above provides an unexpected benefit from the reduction surface area of the first metal layer 414. The functional and/or process tuning can be employed to compensate for reduction in coupling and program ratios, while at the same time making it more difficult for accurate production of unauthorized clones of the printhead 108. The making of unauthorized clones by third parties is a significant threat to printhead manufacturers, such as the Hewlett Packard Company. Printhead manufacturers expend significant resources to prevent the selling and distribution of unauthorized clones of their printheads. It will be difficult for a cloner to achieve identical functional and/or process tuning, resulting in a cloned device having an EPROM exhibiting reduced performance or even being nonfunctional.

Figure 5:
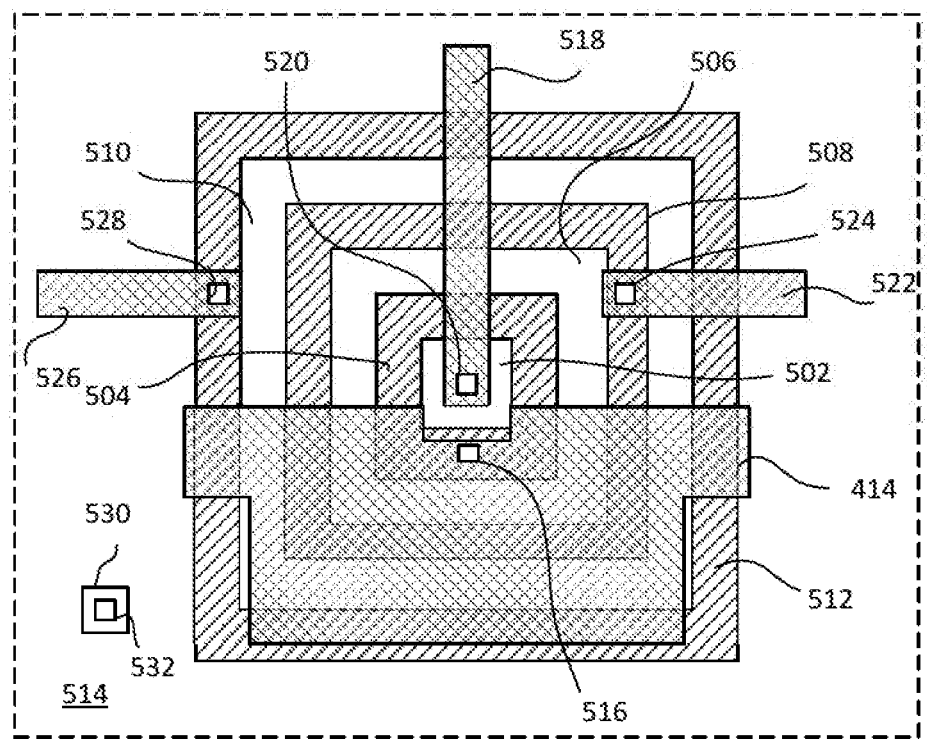
FIG. 5 is a plan view of an EPROM cell according to an example implementation.

FIG. 5 is a plan view 500 of the EPROM cell 112 according to an example implementation. The EPROM cell 112 includes the transistor 302, which comprises a drain 502 (diffusion region 404), an enclosed gate 504 (polysilicon region 410), a source/drain region 506 (diffusion region 406), and the first metal layer 414. The second metal layer 418 has been omitted for clarity, but spans at least the surface area of the EPROM cell 112. The transistors 306 and 308 are formed in series with the transistor 302. That is, the EPROM cell 112 includes an enclosed gate 508, a source/drain region 510, an enclosed gate 512, and a source region 514. The transistor 306 is formed from the source/drain region 506, the enclosed gate 508, and the source/drain region 510. The transistor 308 is formed from the source/drain region 510, the enclosed gate 512, and the source region 514.

The first metal layer 414 is shown in the shape of a T-shirt, but other shapes can be employed. The first metal layer 414 has a particular surface area as discussed above. The first metal layer 414 includes a contact 516 to the enclosed gate 504. Another metal layer 518 can be part of the overall M1 layer) includes a contact 520 to the drain 502. The metal layer 518 provides the read/write terminal. Another metal layer 522 (can be part of the overall M1 layer) includes a contact 524 to the enclosed gate 508. The metal layer 522 provides the row select terminal. Another metal layer 526 (can be part of the overall M1 layer) includes a contact 528 to the enclosed gate 512. The metal layer 526 provides the column select terminal. Another metal layer 530 can include a contact 532 to the source region 514. The metal layer 530 can provide the reference voltage. The EPROM cell 112 is generally shown as having rectangular enclosed gate structures. In other examples, the enclosed gate structures can take on other shapes, including serpentine gate structures.

Figure 6:
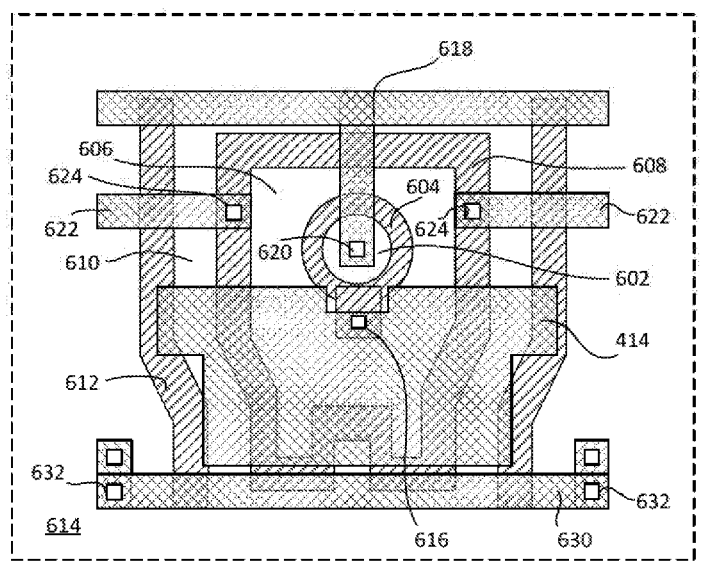
FIG. 6 is a plan view of an EPROM cell according to another example implementation.

FIG. 6 is a plan view 600 of the EPROM cell 112 according to another example implementation. The EPROM cell 112 includes the transistor 302, which comprises a drain 602 (diffusion region 404), an enclosed gate 604 (polysilicon region 410), a source/drain region 606 (diffusion region 406), and the first metal layer 414. The second metal layer 418 has been omitted for clarity, but spans at least the surface area of the EPROM cell 112. The transistors 306 and 308 are formed in series with the transistor 302. That is, the EPROM cell 112 includes an enclosed gate 608, a source/drain region 610, an enclosed gate 612, and a source region 614. The transistor 306 is formed from the source/drain region 606, the enclosed gate 608, and the source/drain region 610. The transistor 308 is formed from the source/drain region 610, the enclosed gate 612, and the source region 614. For EPROM cell 112, only a portion of the enclosed gate 612 is shown. The enclosed gate 612 surrounds a column of EPROM cells 112.

The first metal layer 414 is shown in the shape of a T-shirt, but other shapes can be employed. The first metal layer 414 has a particular surface area as discussed above. The first metal layer 414 includes a contact 616 to the enclosed gate 604. Another metal layer 618 (can be part of the overall M1 layer) includes a contact 620 to the drain 602. The metal layer 618 provides the read/write terminal. Another metal layer 622 (can be part of the overall M1 layer) include contacts 624 to the enclosed gate 608. The metal layer 622 provides the row select terminal. Another metal layer 630 can include contacts 632 to the source region 614. The metal layer 630 can provide the reference voltage.

In the foregoing description, numerous details are set forth to provide an understanding of the present invention. However, it will be understood by, those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. An electronically programmable read-only memory (EPROM) cell, comprising:
   a semiconductor substrate having source and drain regions;
   a floating gate, adjacent to the source and drain regions and separated from the semiconductor substrate by a first dielectric layer, the floating gate comprising:
   a polysilicon layer formed over the first dielectric layer;
   a first metal layer electrically connected to the polysilicon layer, where the surface area of the first metal layer is less than 1000 µm2; and
   a control gate comprising a second metal layer, capacitively coupled to the first metal layer through a second dielectric material disposed therebetween, wherein a coupling ratio defined as CControl/(CControl+CFG) is about 0.6, where CControl is capacitance between the second metal layer and the first metal layer and CFG is capacitance between the floating gate and the semiconductor substrate.

2. The EPROM cell of claim 1, wherein the surface area of the first metal layer is between about 500 µm2 and 250 µm2.

3. The EPROM cell of claim 1, wherein the surface area of the first metal layer is less than 400 µm2.

4. The EPROM cell of claim 1, wherein the second metal layer has a surface area at least equal to a surface area of the EPROM cell.

5. An electronically programmable read-only memory (EPROM) cell, comprising:
   a semiconductor substrate;
   a first transistor formed on the substrate having a floating gate and a control gate, the floating gate including a polysilicon layer and a first metal layer electrically connected to the polysilicon layer and the control gate including a second metal layer capacitively coupled to the first metal layer through a dielectric material, where the surface area of the first metal layer is less than 1000 µm2; and
   second and third select transistors serially coupled between the first transistor and a reference voltage, each of the first and second select transistors having a short-channeled gate (SCG).

6. The EPROM of claim 5, further comprising:
   a column select line and a row select line;
   where the SCG of the second transistor is electrically coupled to the column select line, and the SCG of the third transistor is electrically coupled to the row select line.

7. The EPROM of claim 5, wherein the second metal layer has a surface area at least equal to a surface area of the EPROM cell.

8. The EPROM of claim 5, wherein the surface area of the first metal layer is between about 500 µm2 and 250 µm2.

9. The EPROM cell of claim 5, wherein each of the second and third select transistors comprises a field effect transistor (FET) including a source, a drain, and a gate, the gate having a width such that a channel formed between the source and drain has a length of the same magnitude of depletion-layer widths of the source and the drain.

10. A printhead, comprising:
a plurality of drop ejectors;
a non-volatile memory having an array of cells each having a programmable transistor that is addressable using a column select transistor and a row select transistor, where for each cell:
the programmable transistor includes a floating gate and a control gate, the floating gate including a polysilicon layer and a first metal layer electrically connected to the polysilicon layer and the control gate including a second metal layer capacitively coupled to the first metal layer through a dielectric material, where the surface area of the first metal layer is less than 1000 µm2; and
each of the column select transistor and the row select transistor has a short-channeled gate (SCG).

11. The printhead of claim 10, wherein for each cell the surface area of the first metal layer is between about 500 µm2 and 250 µm2.

12. The printhead of claim 10, wherein for each cell the surface area of the first metal layer is less than 400 µm2.

13. The printhead of claim 10, wherein for each cell a coupling ratio defined as CControl/(CControl+CFG) is about 0.6, where CControl is capacitance between the second metal layer and the first metal layer and CFG is capacitance between the floating gate and the semiconductor substrate.

14. The printhead of claim 10, wherein each of row and column select transistors comprises a field effect transistor (FET) including a source, a drain, and a gate, the gate having a width such that a channel formed between the source and drain has a length of the same magnitude of depletion-layer widths of the source and the drain.

* * * * *

UNITED STATES PATENT AND TRADEMARK OFFICE
CERTIFICATE OF CORRECTION

PATENT NO. : 9,953,991 B2
APPLICATION NO. : 15/119989
DATED : April 24, 2018
INVENTOR(S) : Ning Ge et al.

It is certified that error appears in the above-identified patent and that said Letters Patent is hereby corrected as shown below:

In the Claims

Column 8, Claim 1, Line 22, delete "µm2;" and insert -- $µm^2$; --, therefor.

Column 8, Claim 1, Line 26, delete "CControl/(CControl+CFG)" and insert -- $C_{Control}/(C_{Control}+C_{FG})$ --, therefor.

Column 8, Claim 1, Line 27, delete "CControl" and insert -- $C_{Control}$ --, therefor.

Column 8, Claim 2, Line 32, delete "µm2" and insert -- $µm^2$ --, therefor.

Column 8, Claim 2, Line 33, delete "µm2." and insert -- $µm^2$. --, therefor.

Column 8, Claim 3, Line 35, delete "µm2." and insert -- $µm^2$. --, therefor.

Column 8, Claim 5, Line 49, delete "µm2;" and insert -- $µm^2$; --, therefor.

Column 8, Claim 6, Line 54, after "EPROM" insert -- cell --, therefor.

Column 8, Claim 7, Line 60, after "EPROM" insert -- cell --, therefor.

Column 8, Claim 8, Line 63, after "EPROM" insert -- cell --, therefor.

Column 8, Claim 8, Line 64, delete "µm2" and insert -- $µm^2$ --, therefor.

Column 8, Claim 8, Line 64, delete "µm2." and insert -- $µm^2$. --, therefor.

Column 9, Claim 10, Line 17, delete "µm2;" and insert -- $µm^2$; --, therefor.

Column 10, Claim 11, Line 3, delete "µm2" and insert -- $µm^2$ --, therefor.

Signed and Sealed this
Twenty-fifth Day of December, 2018

Andrei Iancu
*Director of the United States Patent and Trademark Office*

CERTIFICATE OF CORRECTION (continued)
U.S. Pat. No. 9,953,991 B2

Column 10, Claim 11, Line 3, delete "μm2." and insert -- $\mu m^2$. --, therefor.

Column 10, Claim 12, Line 5, delete "μm2." and insert -- $\mu m^2$. --, therefor.

Column 10, Claim 13, Line 7, delete "CControl/(CControl+CFG)" and insert -- $C_{Control}/(C_{Control}+C_{FG})$ --, therefor.

Column 10, Claim 13, Line 8, delete "CControl" and insert -- $C_{Control}$ --, therefor.